US006806773B1

(12) United States Patent
Simmons et al.

(10) Patent No.: US 6,806,773 B1
(45) Date of Patent: Oct. 19, 2004

(54) ON-CHIP RESISTANCE TO INCREASE TOTAL EQUIVALENT SERIES RESISTANCE

(75) Inventors: Aaron Grant Simmons, San Jose, CA (US); Robert Eric Fesler, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 562 days.

(21) Appl. No.: 09/809,863

(22) Filed: Mar. 16, 2001

(51) Int. Cl.[7] .................................................. H03F 1/14

(52) U.S. Cl. ......................... 330/292; 330/67; 330/307; 327/566

(58) Field of Search .......................... 330/292, 67, 307; 327/564, 565, 566, 567; 323/364, 371

(56) References Cited

U.S. PATENT DOCUMENTS 6,373,233 B2 * 4/2002 Bakker et al. .............. 323/282
6,429,745 B1 * 8/2002 Hojo .......................... 330/292

* cited by examiner

*Primary Examiner*—Shawn Riley

(57) ABSTRACT

Voltage regulators use capacitors to compensate the voltage regulator and provide stable performance. Capacitors have an inherent equivalent series resistance (ESR) that changes over various operating conditions including signal frequency, operating temperature as well as others. An apparatus and method compensates for the low ESR of capacitors to increase the total equivalent series resistance of the capacitor. By providing an "on-chip" resistance between the capacitor and the circuit ground potential, minimum total ESR can be provided such that stable load regulation is achieved with capacitors that would otherwise be undesirable for such use. Increasing the value of the output capacitor's equivalent series resistance allows wider ranging values of capacitance to be used. The increased range of capacitance values allows capacitors of different material types to be used. Additionally, other arrangements with multiple resistors that are arranged as series resistors between the compensation capacitor and one or more of the power supplies provide stable load regulation.

18 Claims, 5 Drawing Sheets

ON-CHIP RESISTANCE TO INCREASE TOTAL EQUIVALENT SERIES RESISTANCE

FIELD OF THE INVENTION

The present invention relates to electronic circuits that require a capacitor with a defined equivalent series resistance. In particular, the present invention relates to a method and apparatus that provides for an increase in the minimum total series resistance of a capacitor that may be used for compensation in a low-dropout regulator.

BACKGROUND OF THE INVENTION

Voltage regulators are used to provide a relatively constant voltage source to other electronic circuits that are characterized as a "load". Some regulators have limited effectiveness in particular applications that require load regulation. For example, some regulators have a high "drop-out" voltage. A "drop-out" voltage is the minimum voltage difference between the input voltage and the output voltage that is necessary to maintain proper regulation. Large drop-out voltages result in wasted power, and raise the minimum power supply requirements for maintaining proper regulation.

A low-dropout regulator (hereinafter referred to as an "LDO regulator") is useful in applications where it is desired to maintain a regulated voltage that is sufficiently close to the input voltage. LDO regulators are particularly useful in battery-powered applications where the power supply voltage is low. A capacitor may be added to the LDO regulator's output for stability reasons.

SUMMARY OF THE INVENTION

The present invention is directed to a method and an apparatus for increasing a total effective resistance of a capacitor that may be used in an LDO regulator or other circuit that requires compensation. An improved LDO regulator includes an "on-chip" resistor that is connected in series with the compensation capacitor to increase the total effective series resistance (ESR) of the capacitor. The "on-chip" resistor may be an on-die resistor, an on-die metalization, a lead-frame, a bond-wire, a thin-film resistor, as well as others as applicable. An external capacitor is used to stabilize the LDO regulator. The stability of the LDO regulator is improved by placing the "on-chip" resistor in series with the external capacitor to increase the total effective series resistance.

Briefly stated, voltage regulators use capacitors to compensate the voltage regulator and provide stable performance. Capacitors have an inherent equivalent series resistance (ESR) that changes over various operating conditions including signal frequency, operating temperature as well as others. An apparatus and method compensates for the low ESR of capacitors to increase the total equivalent series resistance of the capacitor. By providing an "on-chip" resistance between the capacitor and the circuit ground potential, minimum total ESR can be provided such that stable load regulation is achieved with capacitors that would otherwise be undesirable for such use. Increasing the value of the output capacitor's equivalent series resistance allows wider ranging values of capacitance to be used. The increased range of capacitance values allows capacitors of different material types to be used. Additionally, other arrangements with multiple resistors that are arranged as series resistors between the compensation capacitor and one or more of the power supplies provide stable load regulation.

In accordance with an example of the present invention, an apparatus for improving compensation in a regulator includes an external capacitor having an equivalent series resistance that is in a range of values. The capacitor is coupled to an output of the regulator. The apparatus also includes an on-chip resistor that has a value. The on-chip resistor is series coupled to the capacitor such that a total effective series resistance of the capacitor is increased. The total effective series resistance is the sum of the value and the range of values. The regulator is stabilized by the capacitor and the on-chip resistor.

In accordance with another example of the present invention, a method of compensating a regulator includes coupling a capacitor between a first on-chip terminal and a second on-chip terminal. The capacitor has an effective series resistance that is below a nominal value. The method also includes coupling one of the first on-chip terminal and the second on-chip terminal through an on-chip resistor to a potential. The sum of the values of the on-chip resistor and the effective series resistance are above the nominal value. The regulator is stabilized by the series combination of the on-chip resistor and the coupling capacitor.

In accordance with yet another example of the present invention, an apparatus for compensating a low drop-out regulator includes a capacitor that is coupled between an output of the low drop-out regulator and a circuit ground potential. The capacitor has an equivalent series resistance that is below a nominal value. The apparatus also includes a means for providing an on-chip resistance that is coupled to the capacitor. The sum of the values of the on-chip resistance and the equivalent series resistance are above the nominal value. The low drop-out regulator includes the on-chip resistor such that the series combination of the on-chip resistor and the capacitor enable stable operation of the low drop-out regulator.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices.

The present invention relates to low-dropout (LDO) regulators and more particularly to low voltage dropout regulators that include an "on-chip" equivalent series resistor. LDO regulators are advantageous as they have the ability to maintain output regulation with very little voltage drop from the unregulated power supply. Voltage regulators use a negative feedback loop to reduce the overall output impedance. The voltage regulator thus holds the output voltage constant independent of the load. The voltage regulator has a corresponding transfer function that includes gain and may also include multiple poles. For stable operation, the loop-gain of the voltage regulator should be rolled off by less than 2 poles.

A capacitor is connected to the output of the LDO regulator to provide stable regulation. Different types of capacitors (i.e., electrolytic, polystyrene, ceramic, etc.) may be used to provide stable performance of the regulator. Each type of capacitor has a various performance criteria such as, for example, leakage characteristics, equivalent series resistance, effective impedance, voltage rating, and operating temperature variations. Many of the performance criteria for capacitors are dependent on the operating frequency or frequencies of the particular capacitor in a given configuration. For example, the effective impedance of the capacitor will drop as the frequency of the signal coupled to the capacitor increases.

A particular compensation capacitor in a particular LDO application is chosen based on various design criteria such as phase margin and gain margin. The phase margin and gain margin of the regulator is a figure of merit for the stability of the regulator. The type and size of the compensation capacitor is limited by the stability requirements of the LDO regulator. Stability problems are encountered in the LDO regulator when a chosen capacitor has an equivalent series resistance that is outside an acceptable range of values (i.e. is too high or too low). The present invention is directed to provide an LDO regulator with improved stability, an increase in usable capacitance values, and the use of additional capacitor material types by connecting the compensation capacitor in series with an "on-chip" ESR. The compensation capacitor is an external capacitor that is used to provide stability to the regulator.

Figure 1:
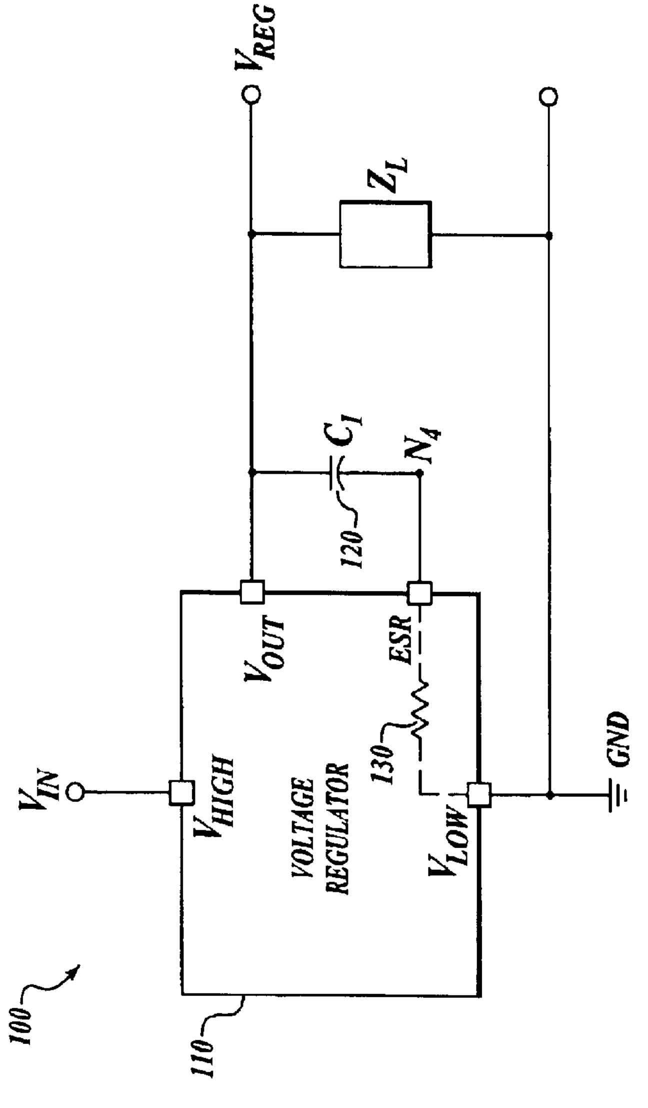
FIG. 1 is a schematic diagram illustrating an LDO regulator according to one embodiment of the present invention.

FIG. 1 is a schematic illustrating an example of a regulator circuit (100) that is in accordance with the present invention. In FIG. 1, the regulator circuit (100) includes a voltage regulator (110), a compensation capacitor (C1, 120), and a load ($Z_L$). The voltage regulator includes a ground terminal ($V_{LOW}$) that is coupled to the circuit ground potential (GND), a power terminal ($V_{HIGH}$) that is coupled to an input voltage ($V_{IN}$), an output terminal ($V_{OUT}$) that provides an output voltage ($V_{REG}$), and an ESR terminal (ESR) that is coupled to node ($N_4$). The load ($Z_L$) is connected between an output of the regulator ($V_{REG}$) and the circuit ground potential (GND). The compensation capacitor (120) is coupled between the output ($V_{REG}$) of the voltage regulator (110) and the ESR terminal at node ($N_4$). The voltage regulator (110) includes a resistor (130) that is internally coupled between the ESR terminal and the ground terminal ($V_{LOW}$). The voltage regulator (110) regulates a voltage ($V_{REG}$) across the load ($Z_L$).

Voltage regulator 110 receives an unregulated input voltage from the input power terminal ($V_{IN}$), regulates the input voltage, and supplies the regulated voltage ($V_{REG}$) across the load $Z_L$. Voltage regulator 110 also includes a feedback loop (not shown, see FIG. 4) that is used to regulate the input voltage. Compensation capacitor 120 provides a positive phase shift, as well as a reduction in loop bandwidth to the feedback loop. Resister 130 is an "on chip" resistor that is arranged in series with the compensation capacitor (120) between the compensation capacitor (120) and the circuit ground potential (GND). The placement of resistor 130 increases the value of the compensation capacitor's 120 equivalent series resistance (see FIG. 2 and discussion below).

Compensation capacitor 120 provides a charge storage means that provides a D.C. source for intermittent dropouts in the regulated voltage. Additionally, the compensation capacitor (120) provides for high frequency compensation of the regulator output by creating a low frequency pole. At high frequencies, the regulator has multiple poles that may cause instability. The instability results in an oscillation in the output voltage ($V_{REG}$) of the voltage regulator (110). The compensation capacitor (120), together with its inherent equivalent series resistor (not shown), provides a zero, thereby compensating for one of the poles. Canceling one of the poles with a zero stabilizes the output of the voltage regulator (110).

Several factors determine whether or not a given capacitor will be suitable for use as the compensation capacitor (120) in a given application, such as, temperature considerations, frequency response, equivalent series resistance, capacitance, etc. In almost every application one or more of these factors must be considered and balanced against the accompanying tradeoff of using an compensation capacitor with a greater or a lesser contribution of the factor. Additionally, the effect of one factor on one or more of the other factors must also be considered. The present invention allows for the reduction of effect of the capacitor's equivalent series resistance from this list of factors. As a result capacitors that are manufactured from different material types may be utilized to stabilize the voltage regulator.

Figure 2:
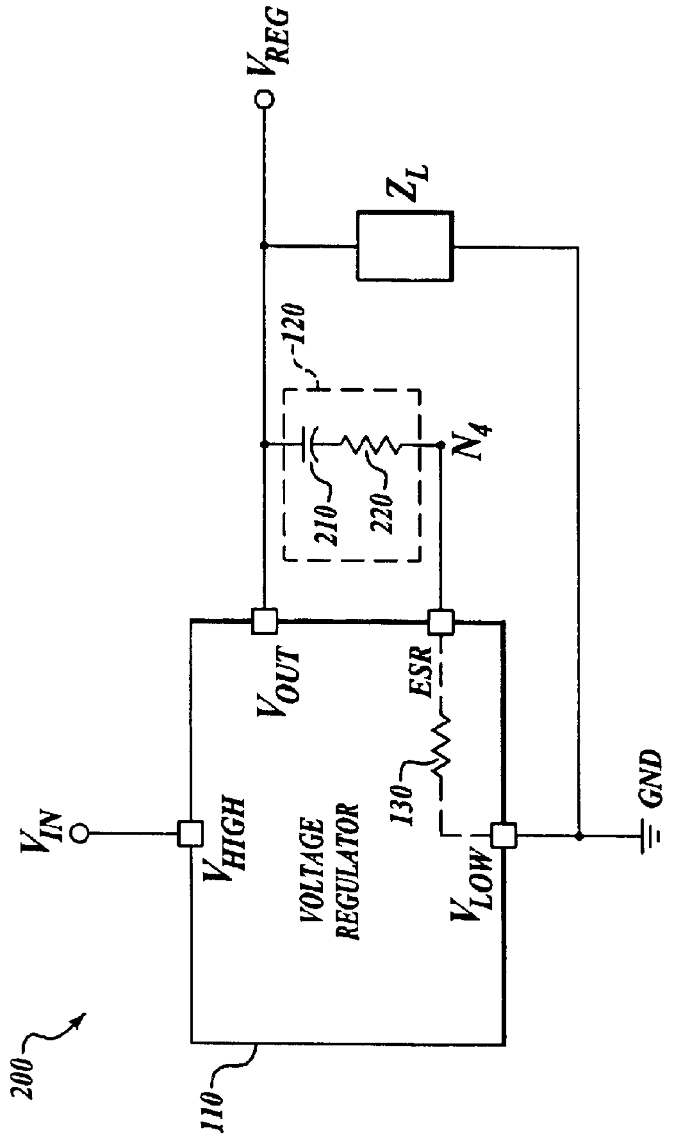
FIG. 2 is a schematic diagram illustrating an LDO regulator and detailing an output capacitor's equivalent series resistor (ESR).

FIG. 2 is a schematic illustrating a regulator circuit (200) that is similar to the schematic illustrated in FIG. 1. Like components from FIGS. 1 and 2 are labeled identically. A detailed equivalent circuit replaces the compensation capacitor (120) from FIG. 1. Compensation capacitor 120 includes an ideal capacitor (210) and an equivalent series resistor (ESR, 220). Ideal capacitor 210 provides insulation resistance (i.e. DC leakage resistance) and ESR 220 provides the positive phase shift that is needed for stability in the voltage regulator (110).

Presently, capacitors utilized in the industry for LDO regulators primarily include those made from electrolytic materials. Electrolytic capacitors may be aluminum or tantalum types, dependant upon the electrode material. Electrolytic capacitors have a voltage-sensitive insulation resistance that provides for sizable equivalent series resistances. Power loss in electrolytic capacitors is a combination of electrode resistance and dielectric losses, resulting in a given resistivity at a specified frequency. For example, a standard tantalum capacitor with a rating of 4.7 $\mu$F might have an ESR of 1.3 Ω@25° C.

Until recently, tantalum capacitors were cost effective for stabilization in most LDO voltage regulator applications. Additionally, although tantalum capacitors are specified at a given resistance, the actual resistance varies over a range of values. The resistance of tantalum capacitors may vary by two or more decades over frequency and temperature ranges.

In light of the above disclosure it is understood and appreciated that a wider range of capacitor types can be accommodated by the present invention, which utilizes an "on-chip" resistor to increase the total effective ESR of the compensation capacitor. Utilizing the present invention, small ceramic capacitors are now an available alternative to tantalum capacitors. Ceramic capacitors have become more cost effective in certain applications and exhibit less variance in equivalent series resistance as their tantalum counterparts. However, ceramic capacitors lack acceptable equivalent series resistance values for many applications. A dramatically larger capacitor could be used but at substantially increased cost. As stated above, equivalent series resistance values outside of a band of acceptable values do not allow for correcting the instability inherent in most LDO voltage regulators. In fact, low equivalent series resistance values may actually cause oscillations to occur, thereby compounding the problem and being wholly unacceptable. Therefore, for small ceramic capacitors to be utilized, the low ESR value of the ceramic capacitor must be compensated.

The present invention provides a solution to both the wide swings in ESR inherent in tantalum capacitors as well as the unacceptably low ESR values inherent in ceramic capacitors. The invention provides for an "on-chip" resistor 130 that is placed in series with the compensation capacitor (120). This configuration provides a method for increasing the total resistance in the capacitive load loop. The result allows for a design to utilize a more desirable range of capacitor values and materials by increasing the unacceptably low equivalent series resistance of the compensation capacitor (120). In one example, a ceramic capacitor with a value of 2.2 uF has an ESR in the range from 6 mΩ to 12 mΩ (nominally 8 mΩ), and the "on-chip" resistance has a nominal value of 200 mΩ such that the variations in the ESR does not substantially impact the total effective series resistance. Tantalum capacitors have ESRs that may be in excess of 5 ohms. For capacitors with higher ESRs, a high on-chip resistor may be employed to reduce the overall effect of changes in ESR for the capacitor over various parameters (i.e., frequency, temperature, etc.).

Figure 3:
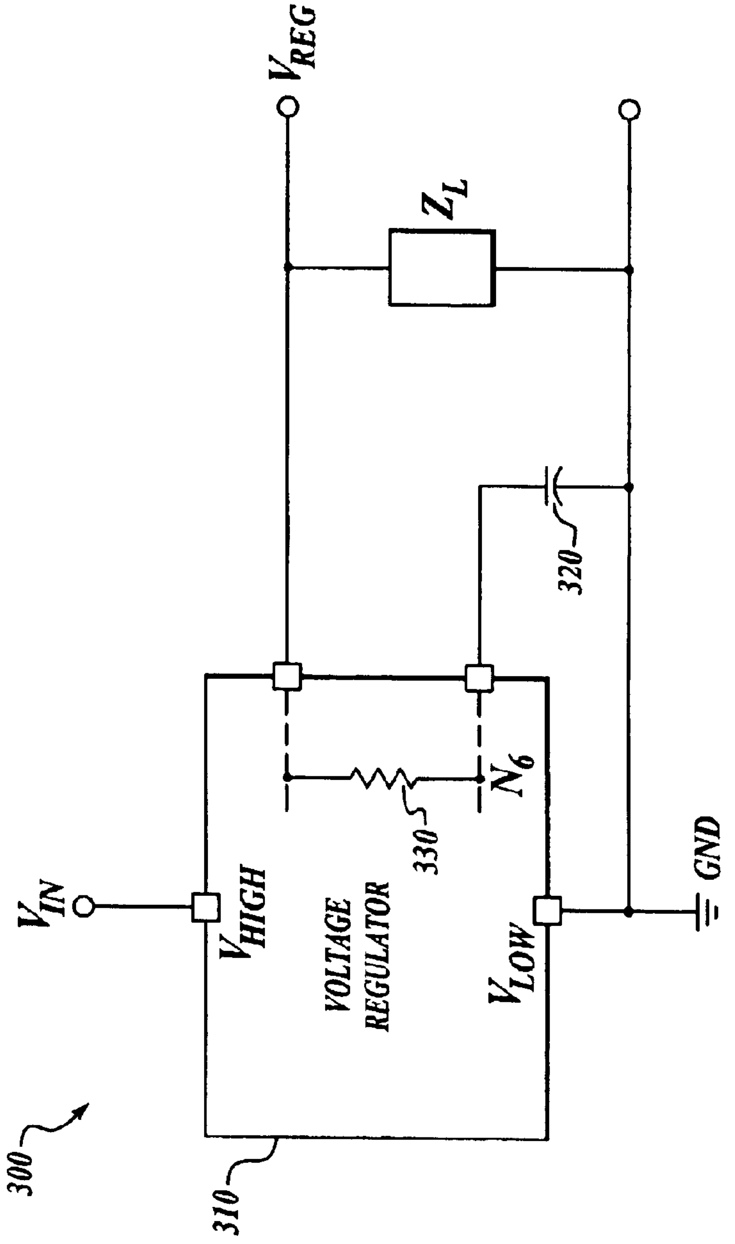
FIG. 3 is a schematic diagram illustrating an LDO regulator according to another embodiment of the invention.

FIG. 3 is a schematic illustrating a regulator circuit (300) in accordance with another embodiment of the present invention. Like components from FIGS. 1 and 3 are labeled identically. The regulator circuit (300) includes a voltage regulator (310) that provides a regulated output voltage ($V_{REG}$) across the load ($Z_L$). In this example, a compensation capacitor (320) is coupled between the ESR terminal at node ($N_6$) and the circuit ground potential (GND). The regulator circuit (310) includes a resistor (330) that is coupled between $V_{REG}$ and the ESR terminal at node ($N_6$). The resistor (330) is an "on-chip" resistor that effectively connects in series with the compensation capacitor (320) to increase the minimum total ESR as discussed previously. This configuration provides added flexibility when designing LDO regulators utilizing the present invention. For example, thermal consideration may require the equivalent series resistor to be mounted elsewhere on the device, or a pin utilized for conmmunication between the compensation capacitor (320) and the "on-chip" resistor (330) may be available elsewhere on the device, and the like.

Figure 4:
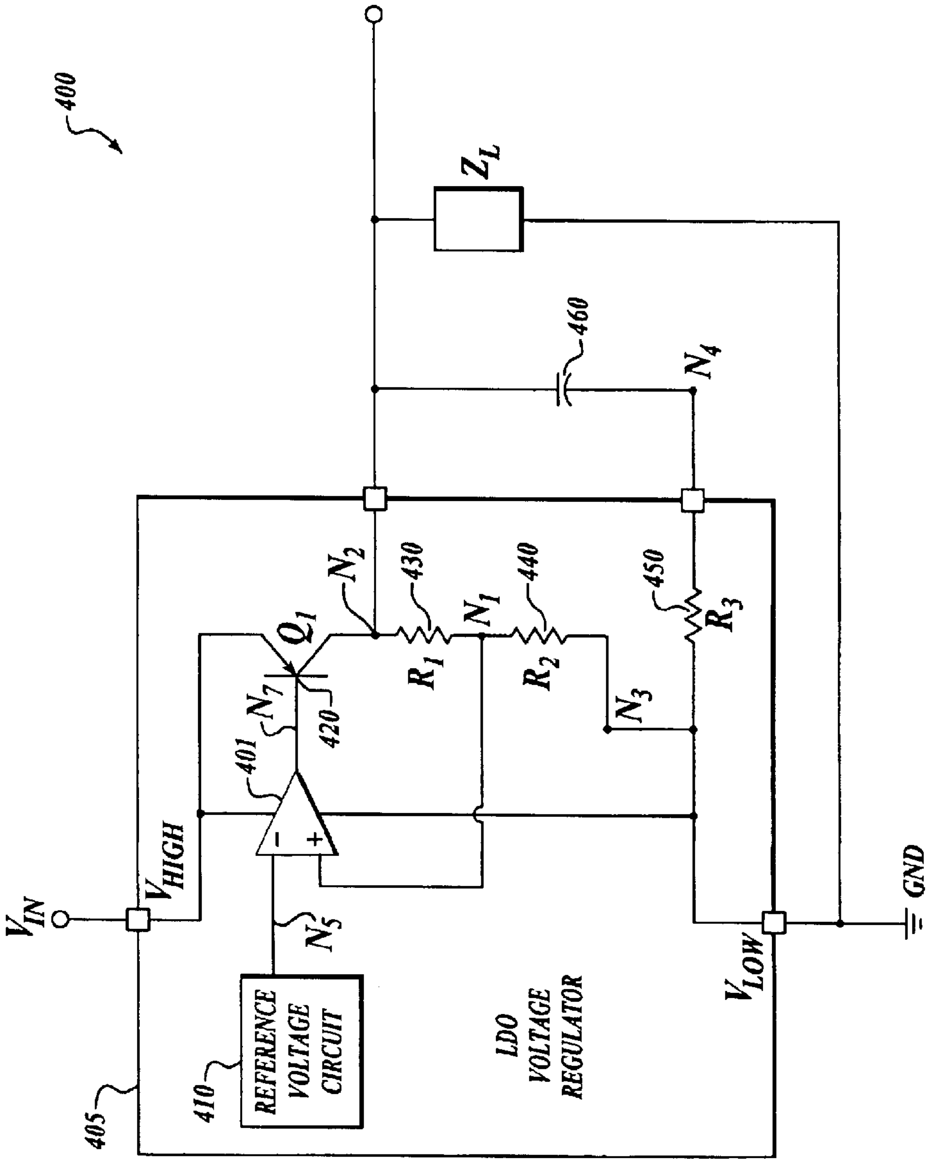
FIG. 4 is a schematic diagram illustrating an exemplary LDO regulator that is similar to the LDO regulator illustrated in FIG. 1, in accordance with the present invention.

FIG. 4 illustrates an exemplary regulator circuit (400) that is similar to the regulator circuit illustrated in FIG. 1, in accordance with the present invention. Regulator circuit 400 includes an operational amplifier (401), a reference voltage circuit (410), a bi-polar junction tansistor (420), three resistors ($R_1$–$R_3$, 430–450), a compensation capacitor (460), and a load ($Z_L$).

Bi-polar junction transistor 420 includes a base connected to node ($N_7$), an emitter connected to the power supply terminal ($V_{HIGH}$), and a collector connected to node $N_2$. Resistor $R_1$ (430) is connected between node $N_1$ and node $N_2$. Resistor $R_2$ (440) is series connected between node $N_1$ and node $N_3$. Resistor $R_3$ (450) is series connected between node $N_3$ and the ESR terminal at node $N_4$. Operational amplifier 401 includes an inverting terminal connected to node $N_5$, a non-inverting terminal connected to node $N_1$, and an output terminal connected to node ($N_7$). The operational amplifier (401) operates off of power that is supplied from the power supply terminal ($V_{IN}$) and node $N_3$. Node $N_3$ is coupled through the ground terminal of the LDO regulator (405) to a circuit ground potential (GND). The compensation capacitor (460) is connected between nodes $N_2$ and $N_4$. The load ($Z_L$) is connected between node $N_2$ and the circuit ground potential (GND). The reference voltage circuit (410) provides a reference voltage ($V_{REF}$) at node $N_5$. The output voltage ($V_{out}$) is measured across load $Z_L$ between node $N_2$ and ground GND.

The bi-polar junction transistor (420) operates as a series regulation device, which is controlled by operational amplifier 401. Operational amplifier 401 acts as an error amplifier and compares the voltage at node $N_1$ with the reference voltage ($V_{REF}$). The output of the error amplifier (401) controls the base of transistor $Q_1$ to equalize the voltages at nodes $N_1$ and $N_5$. Resistors $R_1$ and $R_2$ form a voltage divider that provides a feedback signal at node $N_1$. The output voltage ($V_{out}$) is related to the reference voltage ($V_{REF}$) at node $N_5$ and the ratio of the resistors ($R_1$, $R_2$). The output voltage ($V_{out}$) is given by:

$$(V_{out})=(V_{REF})[1+R_1/R_2]$$

Although FIG. 4 includes a bipolar junction transistor as a series regulation device, it is understood and appreciated that other series regulation devices could be used as well. For example, an NPN transistor, a PMOS transistor, an NMOS transistor, a GaAs FET, JFET, Darlington pair, as well as others may be used as the series regulation device. The resistors ($R_1$, $R_2$) may also be replaced by any other equivalent network that would provide a ratiod feedback to the amplifier. For example, one or more diodes connected in series, transistor devices configured as resistors, etc., may be used as the feedback network.

The resistor $R_3$ (450) is an integrated resistor formed from materials on a microchip. The value of the resistor $R_3$ (450) is related to the choice of capacitor in consideration of stability requirements. In one example, the resistor $R_3$ (450) is an "on-chip" resistor and is formed by a metal material that is used in semiconductor processing, such as, aluminum (Al), copper (Cu), gold (Ag), as well as others.

A total equivalent series resistance is given as the sum of resistance ratings of the resistor $R_3$ (450) and the ESR of the capacitor (460). The value of the resistor $R_3$ (450) and the required capacitance ratings of the compensation capacitor (460) are based on the stability requirements of the LDO regulator (405). As stated previously, the ESR of a given capacitor will vary over frequency, temperature and other parameters. The resistor $R_3$ (450) will adjust the minimum ESR of a chosen capacitor such that an acceptable operating range of total ESR will achieve stable operation of the LDO voltage regulator (405).

Figure 5:
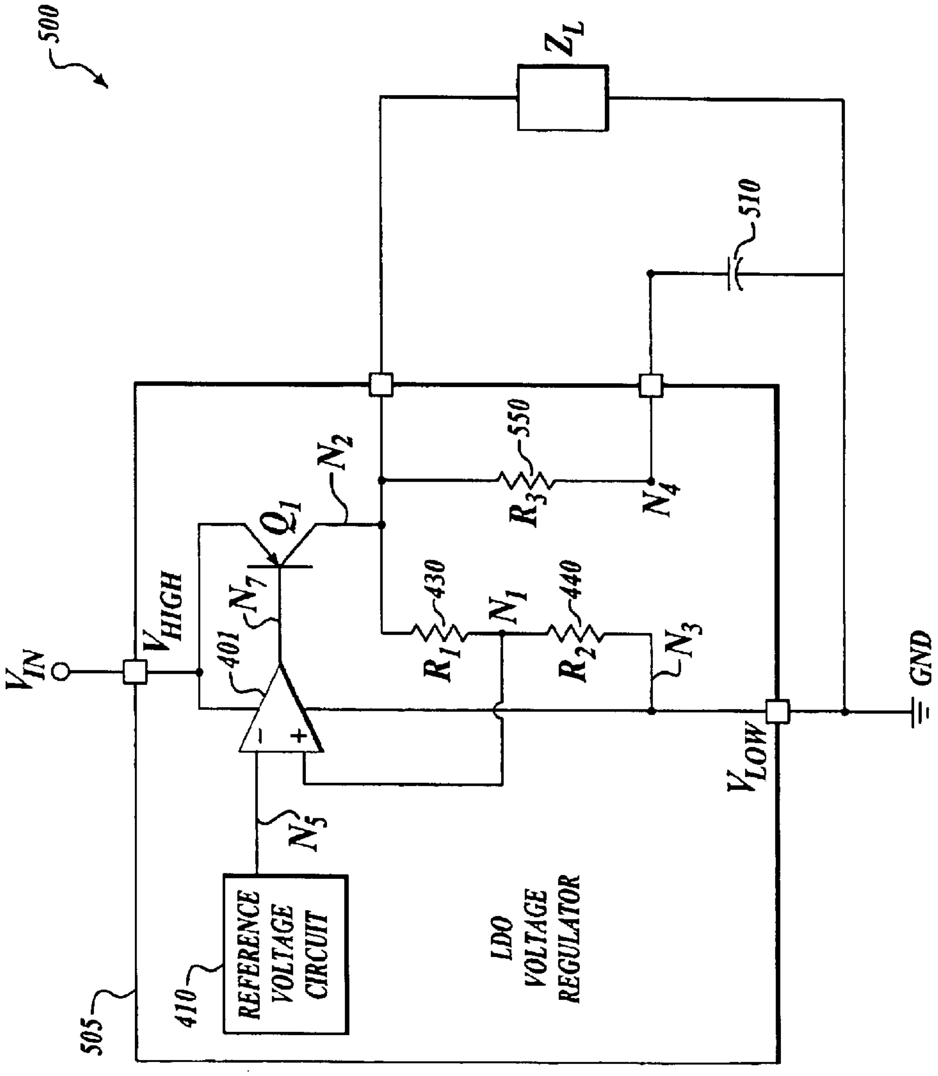
FIG. 5 is a schematic diagram illustrating another exemplary LDO regulator that is similar to the LDO regulator illustrated in FIG. 3, in accordance with the present invention.

FIG. 5 illustrates a regulator circuit (500) that is similar to the regulator circuit illustrated in FIG. 3, in accordance with the present invention. As in FIG. 4, regulator circuit 500 includes an LDO voltage regulator (505), a compensation capacitor (510), and a load ($Z_L$). The LDO voltage regulator (505) includes an operational amplifier (401), a reference voltage circuit (410), a bi-polar junction transistor (420), and three resistors ($R_1$–$R_3$; 430–440, 550). Like components from FIG. 4 are labeled the same in FIG. 5. LDO voltage regulator 505 is configured the same as the LDO voltage regulator (405) shown in FIG. 4, except for the connections of resistor $R_3$ (550) and the compensation capacitor (510).

LDO voltage regulator 505 includes a resistor $R_3$ (550) that is arranged between node $N_2$ and node $N_4$. Node $N_4$ is coupled to the ESR terminal of the LDO voltage regulator (505). The compensation capacitor (510) is connected between the ESR terminal (node $N_4$) and the circuit ground potential (GND).

Although the above description of FIGS. 1–5 illustrate a single resistive component arranged to operate as an "on-chip" resistor in series with the compensation capacitor, it is understood and appreciated that other arrangements are within the scope of the present invention. For example, the single series resistor may be represented as two or more resistors in series and/or parallel combination with one another. Additionally, two or more resistors may be arranged in series with the compensation capacitor. In another embodiment there may be two ESR terminals (e.g.; ESR1, ESR2) that are arranged such that the compensation capacitor is coupled between the two terminals, and one or more resistors are in series with the compensation capacitor on both sides of the plates.

The above specification, examples and data provide a complete description of the manufacture and use of the composition of the invention. Since many embodiments of the invention can be made without departing from the spirit and scope of the invention resides in the claims hereinafter appended.

We claim:

1. An apparatus for improving compensation in a regulator, comprising:

an external capacitor having an equivalent series resistance that is in a range of values, the capacitor is coupled to an output of the regulator; and an on-chip resistor having a value, the on-chip resistor is series coupled to the capacitor such that a total effective series resistance of the capacitor is increased, where the total effective series resistance is the sum of the value and the range of values, whereby the regulator is stabilized by the capacitor and the on-chip resistor.

2. An apparatus as in claim 1, wherein the external capacitor is a ceramic capacitor.

3. An apparatus as in claim 1, wherein the on-chip resistor includes at least one of an on-die resistor, an on-die metallization, a lead-frame, a bond-wire, and a thin-film resistor.

4. An apparatus as in claim 1, wherein the external capacitor is a ceramic capacitor and the on-chip resistor includes at least one of on-die resistor, an on-die metallization, a lead-frame, a bond-wire, and a thin-film resistor.

5. An apparatus as in claim 1, wherein the regulator is a low drop-out voltage regulator.

6. An apparatus as in claim 1, wherein the on-chip resistor is coupled between an on-chip ground terminal and another on-chip terminal that is coupled to the external capacitor.

7. An apparatus as in claim 1, wherein the on-chip resistor is coupled between an on-chip output terminal and an other on-chip terminal, where the output terminal is coupled to the output voltage of the regulator and the external capacitor is coupled to the other on-chip terminal such that the external capacitor is series coupled to the output of the regulator through the on-chip resistor.

8. An apparatus as in claim 1, wherein the on-chip resistor includes at least two effective resistances, a first of the effective resistances is coupled between an on-chip output terminal and a first on-chip ESR terminal, a second of the effective resistances is coupled between an on-chip ground terminal and a second on-chip ESR terminal, and the capacitor is series coupled between the first on-chip ESR terminal and the second on-chip ESR terminal such that the capacitor is series coupled to the at least two effective resistances.

9. An apparatus as in claim 1, wherein the value of the on-chip resistor dominates the total effective series resistance.

10. An apparatus as in claim 1, wherein the on-chip resistor is effective to reduce the effects of variations in the equivalent series resistance of the capacitor.

11. A method of compensating a regulator, comprising:

coupling a capacitor between a first on-chip terminal and a second on-chip terminal, the capacitor having an effective series resistance that is below a nominal value;

coupling one of the first on-chip terminal and the second on-chip terminal through an on-chip resistor to a potential, wherein that the sum of the values of the on-chip resistor and the effective series resistance are above the nominal value and the regulator is stabilized by the series combination of the on-chip resistor and the coupling capacitor.

12. The method of claim 11, wherein the first on-chip terminal corresponds to an output of the regulator and the potential is a circuit ground potential.

13. The method of claim 11, wherein the first on-chip terminal corresponds to a circuit ground potential, and the potential corresponds to an output of the regulator.

14. The method of claim 11, further comprising coupling an other of the first on-chip terminal and the second on-chip terminal through an other on-chip resistor to an output of the regulator, wherein the potential is a circuit ground potential and the capacitor is connected in series between the circuit ground potential and the output of the regulator through the on-chip resistor and the other on-chip resistor.

15. An apparatus for compensating a low drop-out regulator, comprising:

a capacitor that is coupled between an output of the low drop-out regulator and a circuit ground potential, the capacitor having an equivalent series resistance that is below a nominal value; and a means for providing an on-chip resistance that is coupled to the capacitor such that the sum of the values of the on-chip resistance and the equivalent series resistance are above the nominal value, wherein the low drop-out regulator includes the on-chip resistor and the series combination of the on-chip resistor and the capacitor enable stable operation of the low drop-out regulator.

16. An apparatus as in claim 15, wherein the capacitor is a ceramic capacitor with a low equivalent series resistance.

17. An apparatus as in claim 15, wherein the means for providing an on-chip resistance includes at least one of an on-die resistor, an on-die metallization, a lead-frame, a bond-wire, and a thin-film resistor.

18. An apparatus as in claim 15, wherein the means for providing an on-chip resistance dominates the sum of the values of the on-chip resistance and equivalent series resistance such that the low-drop out regulator remains stable with variations in the equivalent series resistance.

* * * * *

UNITED STATES PATENT AND TRADEMARK OFFICE

CERTIFICATE OF CORRECTION

PATENT NO. : 6,806,773 B1
DATED : October 19, 2004
INVENTOR(S) : Aaron G. Simmons et al.

It is certified that error appears in the above-identified patent and that said Letters Patent is hereby corrected as shown below:

Title page,
Below Primary Examiner, insert -- [74] *Attorney, Agent, or Firm*-Darby & Darby P.C.; John W. Branch --.

Column 1,
Line 43, delete “metalization” and insert -- metallization --.

Column 4,
Line 30, delete “an” an insert -- a --.

Column 5,
Line 56, delete “conmmunication” and insert -- communication --
Line 63, delete “tansistor” and insert -- transistor --.

Column 6,
Line 11, delete “terninal” and insert -- terminal --.
Line 39, delete “ratiod” and insert -- ratioed --.

Column 7,
Line 29, after “invention” insert -- , the invetion --.

Signed and Sealed this

Nineteenth Day of April, 2005

JON W. DUDAS
*Director of the United States Patent and Trademark Office*